(12) United States Patent
Eckert

(10) Patent No.: US 10,606,170 B2
(45) Date of Patent: Mar. 31, 2020

(54) TEMPLATE FOR IMPRINT LITHOGRAPHY AND METHODS OF MAKING AND USING THE SAME

(71) Applicant: CANON KABUSHIKI KAISHA, Tokyo (JP)

(72) Inventor: Andrew R. Eckert, Pflugerville, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 107 days.

(21) Appl. No.: 15/704,914

(22) Filed: Sep. 14, 2017

(65) Prior Publication Data

US 2019/0079389 A1    Mar. 14, 2019

(51) Int. Cl.
| | |
|---|---|
| *G03F 7/00* | (2006.01) |
| *H01L 21/027* | (2006.01) |
| *H01L 21/67* | (2006.01) |
| *H01L 27/105* | (2006.01) |

(52) U.S. Cl.
CPC ........ *G03F 7/0002* (2013.01); *H01L 21/0271* (2013.01); *H01L 21/6715* (2013.01); *H01L 21/67092* (2013.01); *H01L 27/1052* (2013.01)

(58) Field of Classification Search
CPC .................................................... H01L 21/00
See application file for complete search history.

(56) References Cited

U.S. PATENT DOCUMENTS

| | | | |
|---|---|---|---|
| 6,842,229 B2 | 1/2005 | Sreenivasan et al. | |
| 6,852,454 B2 | 2/2005 | Mancini et al. | |
| 6,916,585 B2 | 7/2005 | Sreenivasan et al. | |
| 6,921,615 B2 | 7/2005 | Sreenivasan et al. | |
| 7,027,156 B2 | 4/2006 | Watts et al. | |
| 7,150,622 B2 | 12/2006 | Choi et al. | |
| 7,303,383 B1 | 12/2007 | Sreenivasan et al. | |
| 7,323,130 B2 | 1/2008 | Nimmakayala et al. | |
| 7,396,475 B2 | 7/2008 | Sreenivasan | |
| 7,654,816 B2 | 2/2010 | Chen | |
| 7,690,910 B2 | 4/2010 | Nakamura et al. | |
| 7,785,826 B2 | 8/2010 | Ehlers et al. | |
| 7,927,541 B2 | 4/2011 | Sreenivasan | |
| 8,470,188 B2 | 6/2013 | Menezes | |
| 8,616,873 B2 | 12/2013 | Miller et al. | |
| 8,691,124 B2 | 4/2014 | Wuister et al. | |
| 8,992,789 B2 * | 3/2015 | Suzuki | B29C 33/3842 216/41 |

(Continued)

*Primary Examiner* — Caridad Everhart
*Assistant Examiner* — Ankush K Singal
(74) *Attorney, Agent, or Firm* — Abel Schillinger, LLP

(57) ABSTRACT

A template for imprint lithography can include an active area that includes a plurality of tiers including a first tier and a second tier, and a first feature within the first tier or the second tier. In another embodiment, the first and second tiers include features, and the average feature depth or height within the first tier may be substantially the same as or different from the average feature depth or height within the second tier. The template can be used in imprinting a formable layer to form a patterned resist layer over a device substrate that has at least two tiers. The template and its use are well suited for device substrates having exposed surfaces at significantly different elevations, particularly where planarization would be complicated or nearly impossible to implement.

13 Claims, 7 Drawing Sheets

(56) References Cited

U.S. PATENT DOCUMENTS

| | | | |
|---|---|---|---|
| 2004/0224261 A1 | 11/2004 | Resnick et al. | |
| 2006/0258129 A1* | 11/2006 | Park | H01L 21/76224 438/527 |
| 2006/0261518 A1 | 11/2006 | Willson et al. | |
| 2009/0130598 A1 | 5/2009 | Schmid et al. | |
| 2009/0214689 A1 | 8/2009 | Bailey et al. | |
| 2010/0092599 A1* | 4/2010 | Selinidis | B82Y 10/00 425/470 |
| 2010/0252188 A1* | 10/2010 | Inanami | B32B 37/10 156/280 |
| 2011/0062623 A1* | 3/2011 | Saito | B82Y 10/00 264/219 |
| 2011/0189438 A1* | 8/2011 | Furusho | B29C 33/40 428/156 |

* cited by examiner

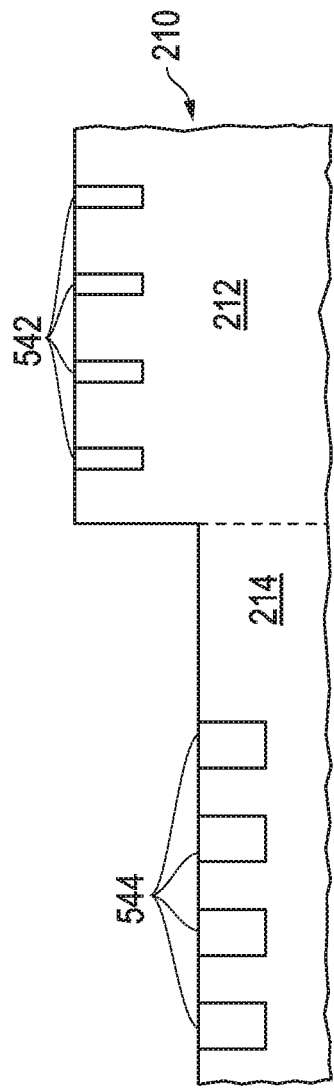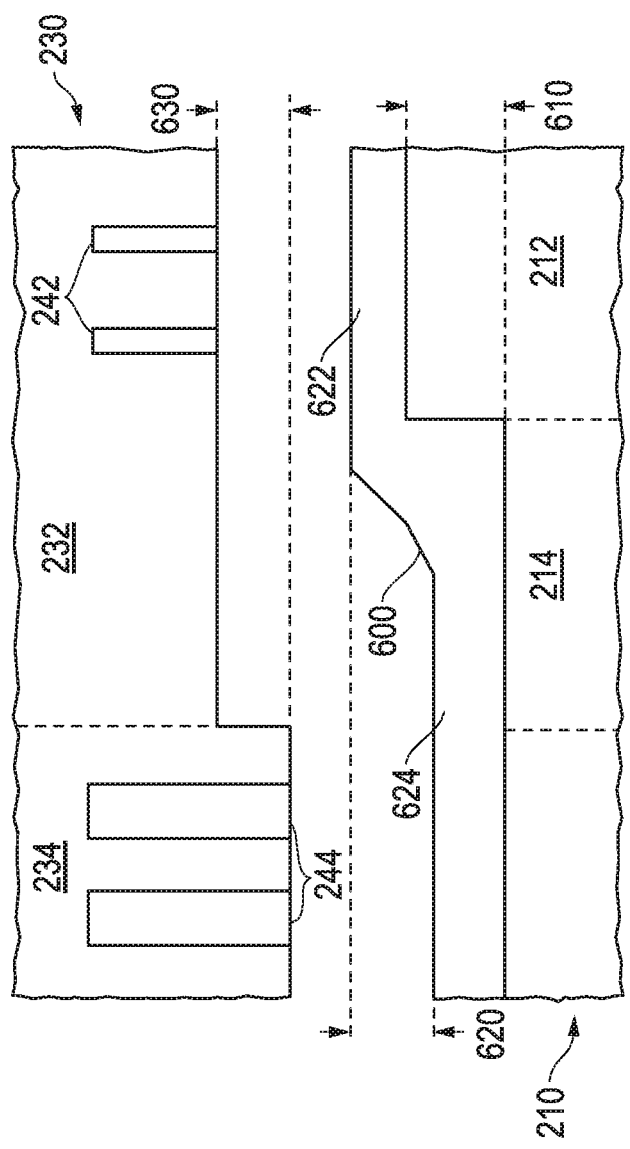
FIG. 5
FIG. 6

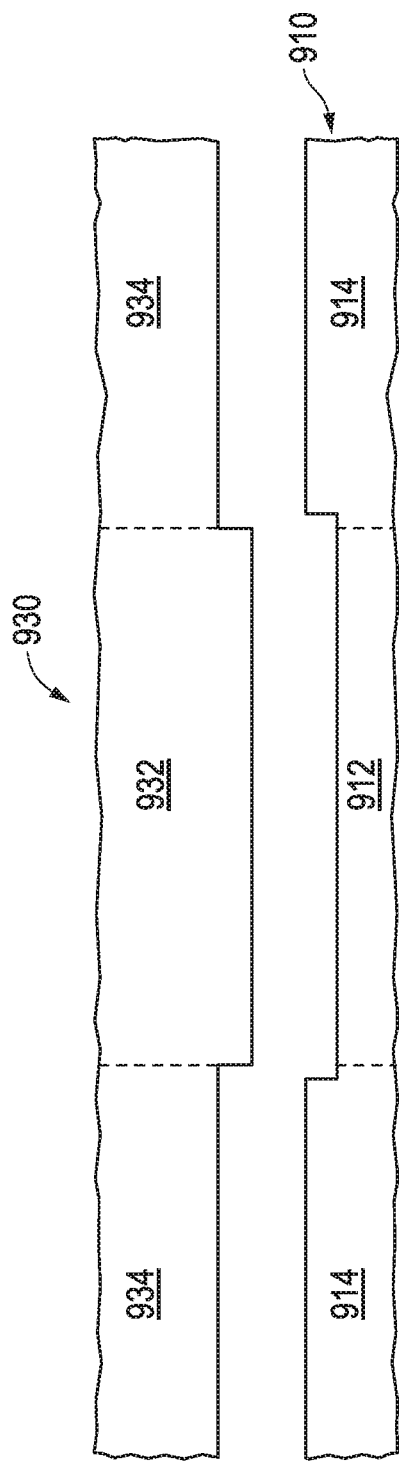
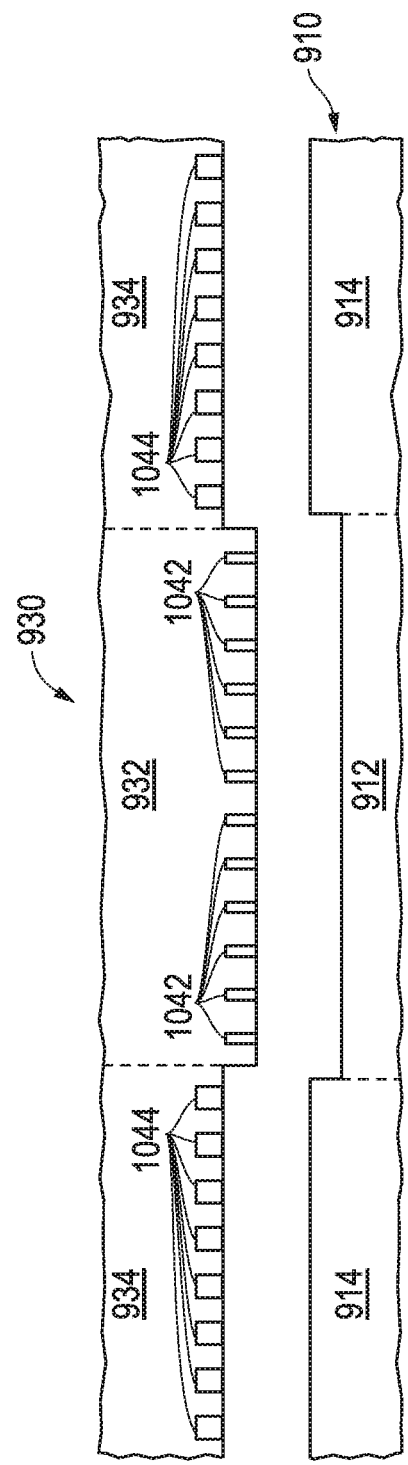

TEMPLATE FOR IMPRINT LITHOGRAPHY AND METHODS OF MAKING AND USING THE SAME

FIELD OF THE DISCLOSURE

The present disclosure relates to imprint lithography, and more particularly to templates for imprint lithography applications and methods of making and using such templates.

RELATED ART

Imprint lithography apparatuses and processes are useful in forming nanoscale patterns on semiconductor wafers in the fabrication of electronic devices. Such apparatuses and processes can include the use of fluid dispense systems for depositing a formable material, for example, a polymerizable material, such as a resin or a resist layer, onto the wafer, using techniques such as fluid droplet dispense. The dispensed material is contacted with an imprint template (or mold) having desired pattern features and then solidified, forming a patterned layer on the wafer.

Patterns of components being formed during fabrication of electronic devices on the wafer are becoming more complex. Exposed surfaces of the substrate can lie at different elevations. An example of such a substrate can include an electronic device that includes a memory array and logic region. The memory array may include two or more polysilicon layers, and the logic region may include transistors having a single gate polysilicon layer. In another embodiment, more electronic components on the same electronic device can lead to more interconnect levels to properly connect the electronic components to one another. Higher electronic component densities generally correspond to smaller device sizes. As component densities within electronic devices increase, the number of elevational levels, differences in elevation, or both increase.

The combination of smaller device sizes and more elevational issues provide many challenges to lithographic processes. Many conventional lithographic processes require planar exposed surfaces. However, an exposed surface along a single plane may not be achievable or require complex extra processing to make the exposed surface planar. Improvements in lithography are desired to allow patterning of more complex topographies.

SUMMARY

In an aspect, a template for imprint lithography comprises an active area including a plurality of tiers including a first tier and a second tier; and a feature within the first tier or the second tier.

In an embodiment, the first and second tiers comprise features, including the feature, wherein all depths of the features of the first and second tiers are within 5% of an average depth of the features of the first and second tiers, or all heights of the features of the first and second tiers are within 5% of an average height of the features of the first and second tiers.

In another embodiment, the first and second tiers comprise features, including the feature, wherein:
  a depth of a particular feature of the first tier is at least 5% greater than a depth of a particular feature of the second tier;
  a depth of a particular feature of the second tier is at least 5% greater than a depth of a particular feature of the first tier;
  a height of a particular feature of the first tier is at least 5% greater than a height of a particular feature of the second tier; or
  a height of a particular feature of the second tier is at least 5% greater than a height of a particular feature of the first tier.

In a particular embodiment, all of the features within the first and second tiers have corresponding proximal surfaces that lie at substantially the same elevation.

In a further embodiment, the first and second tiers comprise features, including the first feature, wherein an average width of features in the first tier is smaller than the average width of features in the second tier.

In a particular embodiment, the first tier is recessed farther into the template, as compared to the second tier.

In another particular embodiment, the first tier corresponds to a memory array, and the second corresponds to a region outside the memory array.

In another embodiment, the first tier includes an exclusion zone.

In another aspect, a method of forming a template for imprint lithography comprises patterning the template to define tiers including a first tier and a second tier; and patterning the template to define a feature, wherein, in a finished template, the feature is within the first tier or the second tier.

In an embodiment, patterning the template to define the tiers is performed such that the first tier is recessed farther into the template.

In a particular embodiment, patterning the template to define the first feature comprises patterning the template to define features, including the first feature, and patterning the template to define the features is performed such that, in a finished template, an average depth of the features of the first tier is greater than an average depth of the features of the second tier, or an average height of the features of the first tier is greater than an average height of the features of the second tier.

In another embodiment, patterning the template to define the first feature is performed, such that no feature is defined within the first tier at an exclusion zone adjacent to the second tier.

In a further aspect, a method of can include manufacturing an article. The method comprises:
  dispensing a formable material over a substrate, wherein the substrate includes a first tier and a second tier;
  contacting the formable material with a template comprising an active area including a third tier and a fourth tier, wherein the first and second tiers of the substrate corresponds to the third and fourth tiers of the template while contacting the formable material with the template, and a feature within the first tier or the second tier; and
  curing the formable material to form a patterned resist layer corresponding to the template.

In an embodiment, the article includes an electronic device, and the substrate includes a semiconductor wafer.

In a particular embodiment, the substrate has a nonplanar surface within an imprint field when dispensing the formable material.

In another particular embodiment, the substrate lies within a first region and a second region, wherein:
  a first average elevation along a surface of the substrate within the first region is higher than a second average elevation of the surface of the substrate within the second region; and the first tier is recessed further into the template as compared to the second tier.

In a more particular embodiment, the first region has more device layers as compared to the second region.

In another more particular embodiment, the first tier of the template includes an exclusion zone, and after the formable material, the patterned resist layer has a residual layer, wherein a portion of the residual layer corresponding to the exclusion zone is thicker than each of a portion of the residual layer corresponding to the second tier and a portion of the residual layer corresponding to a remaining portion of the first tier that is outside the exclusion zone.

In a still more particular embodiment, the portion of the residual layer corresponding to the second tier and the portion of the residual layer corresponding to the remaining portion of the first tier are substantially the same.

In yet another most particular embodiment, the method further comprises forming a sacrificial layer over the substrate before dispensing the formable material onto the substrate, wherein:

the sacrificial layer lies within the first and second regions;

a third average elevation along an upper surface of the sacrificial layer within the first region is higher than a fourth average elevation of the upper surface of the sacrificial layer within the second region; and a difference between the first and second average elevations is greater than a difference between the third and fourth average elevations.

BRIEF DESCRIPTION OF THE DRAWINGS

Embodiments are illustrated by way of example and are not limited in the accompanying figures.

FIG. 5 includes an illustration of a cross-sectional view of the substrate of FIG. 5 after removing portions of the substrate and removing remaining portions of the patterned and planarization layers.

FIG. 6 includes an illustration of a cross-sectional view of portions of a device substrate and a template in accordance with another embodiment after forming a coated layer that reduces the height difference over the substrate.

FIG. 9 includes an illustration of a cross-sectional view of portion of a device substrate and a template that is patterned to form tiers.

FIG. 10 includes an illustration of a cross-sectional view of the template of FIG. 9 after patterning exposed portions of the template to define features along each of the tiers in accordance with an embodiment.

Figure 1:
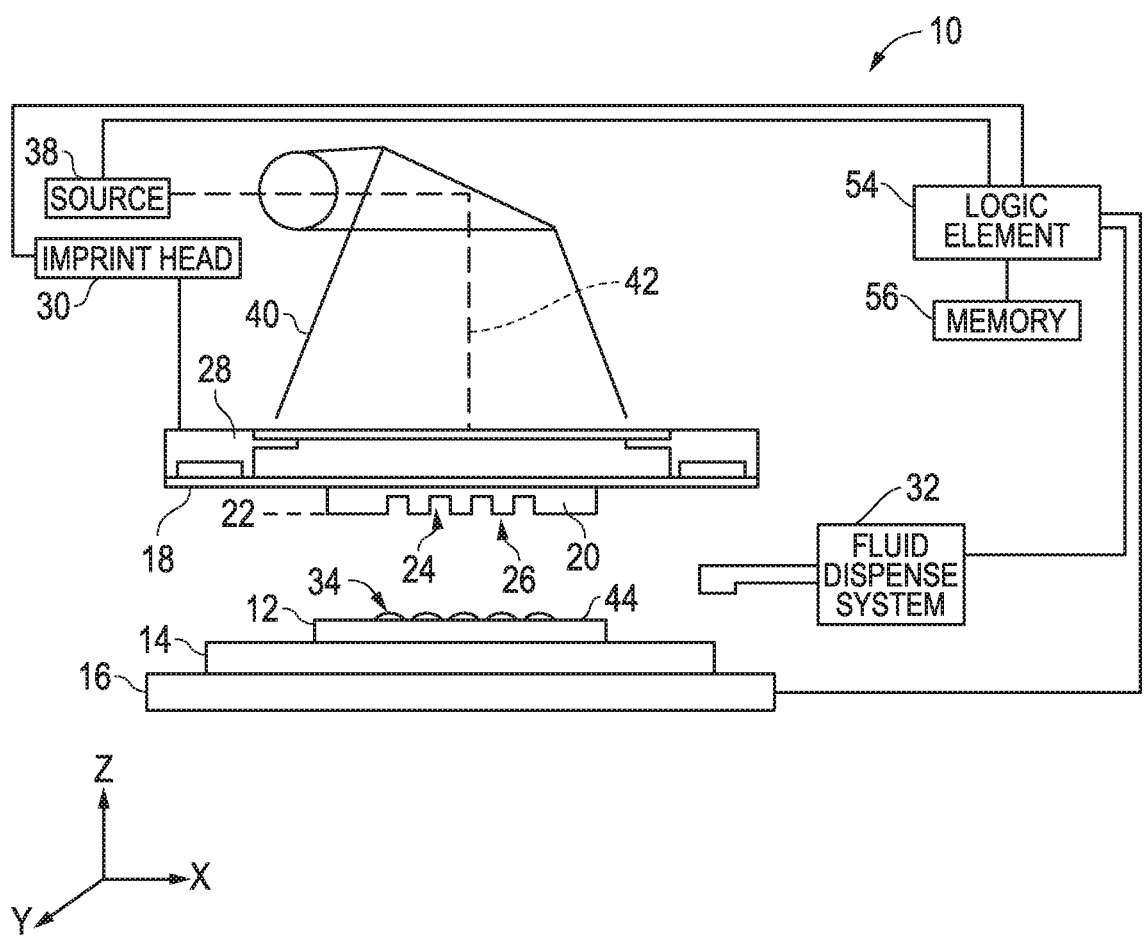
FIG. 1 includes an illustration of a side view of an exemplary imprint lithography system.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

The term "device layer" is intended to mean a layer of device substrate. Examples of device layers include conductive layers, semiconductor layers, and insulating layers. Such layers may be parts of electronic components of an electronic device formed on or within the device substrate.

The term "device substrate" is intended to mean a substrate from which electronic devices may be formed. The device substrate may include a semiconductor base material but may include an insulating base material, such as a glass, sapphire, spinel, or the like. The device substrate may be in the form of a wafer.

The term "active area" is intended to mean an area of an imprint surface of an imprint template or a device surface of a device substrate that excludes portions of such area having metrology features (for example, alignment-assist marks, features used for measuring dimensions or amount of misalignment, or the like) or scribe lanes. The active area includes a portion of the area where features corresponding to electronic components are formed on the device substrate.

The term "distal," with respect to a surface of a feature, is intended to mean a surface that lies farther from a body of a material. For example, the upper surface of a protrusion is a distal surface of the protrusion. The term "proximal," with respect to a surface of a feature, is intended to mean a surface that lies farther into a body of a material. For example, the bottom surface of a recession is a proximal surface of the recession.

The use of the word "about", "approximately", or "substantially" is intended to mean that a value of a parameter is close to a stated value or position. However, minor differences may prevent the values or positions from being exactly as stated. Thus, differences of up to ten percent (10%) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

A template for imprint lithography can include an active area that includes a plurality of tiers including a first tier and a second tier, and a first feature within the first tier or the second tier. In another embodiment, the first and second tiers include features, and the average feature depth or height within the first tier may be substantially the same as or different from the average feature depth or height within the second tier. The template can be used in imprinting a formable layer to form a patterned resist layer over a device substrate that has at least two tiers. The template and its use are well suited for device substrates having exposed surfaces at significantly different elevations, particular where planarization would be complicated or nearly impossible to implement. Such devices can include a three-dimensional memory array, a helical inductor, or another component or region that has an uppermost surface that lies at an elevation substantially other than other exposed surfaces along a device substrate.

Details regarding the templates and method of making and using such templates are better understood after reading this specification in conjunction with figures. The description below is meant to illustrate embodiments and not limit the scope of the present invention, which is defined in the appended claims.

Referring to FIG. 1, a lithographic system 10 in accordance with an embodiment described herein can be used to form a relief pattern on a substrate 12. The substrate 12 may be coupled to a substrate chuck 14. As illustrated, the substrate chuck 14 is a vacuum chuck; however, in other embodiments the substrate chuck 14 may be any chuck including vacuum, pin-type, groove-type, electrostatic, electromagnetic, or the like. The substrate 12 and substrate chuck 14 may be further supported by a stage 16. The stage 16 may provide translating or rotational motion along the X-, Y-, or Z-directions. The stage 16, substrate 12, and substrate chuck 14 may also be positioned on a base (not illustrated).

Spaced-apart from the substrate 12 is a template 18. The template 18 can include a body having a first side and a second side with one side having a mold 20 extending therefrom towards the substrate 12. The mold 20 is sometimes referred to as a mesa. In an embodiment, the template 18 can be formed without a mold 20.

The template 18, mold 20, or both may be formed from such materials including fused-silica, quartz, silicon, organic polymers, siloxane polymers, borosilicate glass, fluorocarbon polymers, metal, hardened sapphire, other similar materials, or any combination thereof. The template 18 and mold 20 can include a single piece construction. Alternatively, the template 18 and mold 20 can include separate components coupled together.

An imprint surface 22 of the mold 20 includes features defined by spaced-apart recesses 24 and protrusions 26. The imprint surface 22 may define a pattern that corresponds to a pattern to be formed on the substrate 12. The template 18 as illustrated in FIG. 1 is provided for purposes of illustrating where the template 18 is located within the apparatus 10. Particular patterns of the templates are described below with resect to particular embodiments.

The template 18 can be coupled to a chuck 28. The chuck 28 can be configured as vacuum, pin-type, groove-type, electrostatic, electromagnetic, or another similar chuck type. In an embodiment, the chuck 28 may be coupled to an imprint head 30 such that the chuck 28 or imprint head 30 can facilitate movement of the template 18.

The lithographic system 10 can further include a fluid dispense system 32 used to deposit a formable material 34 on the substrate 12. For example, the formable material 34 can include a polymerizable material, such as a resin. The formable material 34 can be positioned on the substrate 12 in one or more layers using techniques such as droplet dispense, spin-coating, dip coating, chemical vapor deposition (CVD), physical vapor deposition (PVD), thin film deposition, thick film deposition, or combinations thereof. The formable material 34 can be dispensed on the substrate 12 before or after a desired volume is defined between the mold 20 and the substrate 12, depending on design considerations. For example, the formable material 34 can include a monomer mixture that can be cured using ultraviolet light, heat, or the like.

The lithographic system 10 can further include an energy source 38 coupled to a direct energy 40 along a path 42. The imprint head 30 and stage 16 can be configured to position the template 18 and substrate 12 in superimposition with the path 42. The lithographic system 10 can be regulated by a logic element 54 in communication with the stage 16, imprint head 30, fluid dispense system 32, or source 38, and may operate on a computer readable program, optionally stored in memory 56. The logic element 54 may be a processor (for example, a central processing unit of a microprocessor or microcontroller), a field-programmable gate array (FPGA), an application specific integrated circuit (ASIC), or the like. The processor, FPGA, or ASIC can be within the apparatus. In another embodiment (not illustrated), the logic element can be a computer external to the apparatus 10 and is bidirectionally coupled to the apparatus 10.

Although the substrate 12 is illustrated as having a flat exposed surface, in practice the substrate 12 is not flat. Templates, as described below, can have tiers at different elevations with a feature, such as a protrusion or recession within the template, at any of the tiers. Such templates can allow for the proper patterning of a formable material at the different tiers without needing a complicated planarization process to make the exposed surface along the substrate completely flat.

Figure 2:
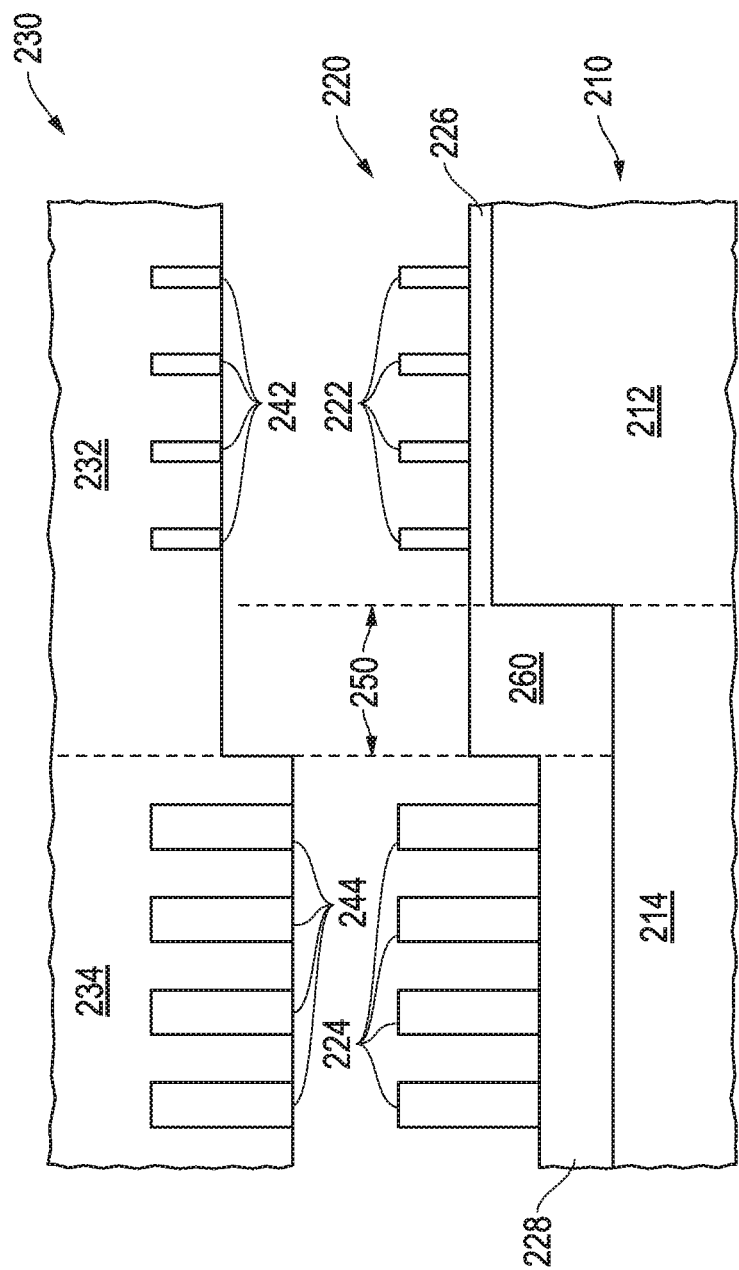
FIG. 2 includes an illustration of a cross-sectional view of portions of a device substrate and a template in accordance with an embodiment after forming a patterned layer.

FIG. 2 illustrates an embodiment that includes portions of a device substrate 210 and a template 230 after patterning a resist layer 220. The device substrate 210 has a nonplanar surface within an imprint field. As can be seen in FIG. 2, the device substrate 210 has tiers 212 and 214 that lie at different elevations. The tiers 212 and 214 can correspond to different parts of a die. For example, the tier 212 may have more device layers as compared to the tier 214. In a particular embodiment, the tier 212 can correspond to a memory array, and the tier 214 can correspond to a region outside the memory array. The region outside the memory array may include circuitry to support the memory array, such as a column or row address strobe, a column or row decoder, a sense amplifier or the like. In another embodiment, the tier 212 may include a relatively more complicated or larger electronic component, such as a helical inductor. In a further embodiment, the tier 212 may have a relatively higher component density and has more interconnect levels as compared to the tier 214. After reading this specification, skilled artisans will be able to determine which components within the device substrate 210 are located within each of the tiers 212 and 214. In an embodiment, the difference in elevations for the tiers 212 and 214 can be at least 5 nm, at least 11 nm, or at least 20 nm, and in another embodiment, the difference can be at most 1000 nm, at most 200 nm, or at most 90 nm. In a further embodiment, the difference may be less than or greater than the previously described elevations.

In order to properly pattern the resist layer 220, the template 230 can have a topography along the imprint surface 240 that is complementary to the topography of the substrate 210. In the embodiment as illustrated, the template 230 has tiers 232 and 234 that lie at different elevations and correspond to the tiers 212 and 214 of the device substrate 210. The tier 232 is recessed further into the body of the template 230 as compared to the tier 234. The difference in elevation of the tiers 232 and 234 of the template 230 may be the same or less than the difference in elevation of the tiers 212 and 214 of the device substrate 210.

In forming the resist layer 220, a formable material is dispensed onto the exposed surface of the device substrate 210. The template 230 contacts the formable material during an imprint operation, and the formable material is cured to form the resist layer 220. During the imprint operation, contact between the template 230 and device substrate 210 is to be avoided. Accordingly, an exclusion zone 250 is used to reduce the likelihood of incidental contact between the template 230 and the device substrate 210. The exclusion zone 250 is the lateral distance from the tier transition between the tiers 212 and 214 of the device substrate 210 to the tier transistor between the tiers 232 to 234 of the template 230. In an embodiment, the exclusion zone 250 can be at least 50 nm, at least 110 nm, or at least 200 nm, and in another embodiment, exclusion zone 250 can be at most 2000 nm, at most 1500 nm, or at most 950 nm. In a further embodiment, the exclusion zone 250 may be narrower than or wider than the previously described values.

In the illustrated embodiment, all recessions 242 in the tier 232 can have substantially the same depth, and all recessions 244 in the tier 234 can have substantially the same depth. However, the average depth of the recessions 244 can be at least 5% greater than the average depth of the recessions 242. The depths of the recessions 242 and 244 can be designed so that the resist layer 220 formed by the shape of the imprint surface 240 includes protrusions 222 and 224 that have upper surfaces that lie at substantially the same elevation.

The actual widths and pitches of features within each tier can depend on the size of electronic components being formed on the device substrate 210. In FIG. 2, the recessions 242 are illustrated as having the same widths and pitch, and the recessions 244 are illustrated as having the same widths and pitch. In practice, the actual widths and pitches can depend on the size of electronic components being formed on the device substrate 210. In a particular embodiment, the tier 212 may have a relatively higher component density as compared to the tier 214. For example, the tier 214 may include larger geometry features, such as bond pads, buses, electrostatic discharge structures, or the like. Thus, the average width and pitch of the recessions 242 may be smaller than the average width and pitch of the recessions 244.

The exposed surface of the resist layer 220 is a complementary image of the imprint surface 240 of the template 230. In the illustrated embodiment, the resist layer 220 can have features that include four protrusions 222 overlying the tier 212, wherein the protrusions 222 can have substantially the same height. The resist layer 220 can further include features that include four protrusions 224 overlying the tier 214, wherein the protrusions 224 can have substantially the same height. However, the average height of the protrusions 224 can be at least 5% greater than the average height of the protrusions 222. In a particular embodiment, the protrusions 222 and 224 have distal (upper) surfaces that lie at substantially the same elevation.

As illustrated in FIG. 2, other parts of the resist layer 220 outside the protrusions 222 and 224 is the residual layer. The portion 226 of the residual layer over the tier 212 is thinner than the portion 228 of the residual layer over the tier 214. The difference in thickness between the portions 226 and 228 corresponds to the difference in elevations of the tiers 232 and 234 of the template 230. In a particular embodiment, the difference in thickness between the portions 226 and 228 is substantially the same as the difference in elevations of the tiers 232 and 234 of the template 230. The portion 260 of the residual layer corresponds to the exclusion zone 250 and is thicker than each of the portions 226 and 228. In a further embodiment, the difference in elevations of the substrate tiers 212 and 214 is substantially the same as the difference in elevations of the template tiers 232 and 234. In this embodiment, the thicknesses of the portions 226 and 228 of the residual layer are substantially the same. In another embodiment, the portions 226 and 228 of the residual layer may have slightly different thicknesses.

Figure 3:
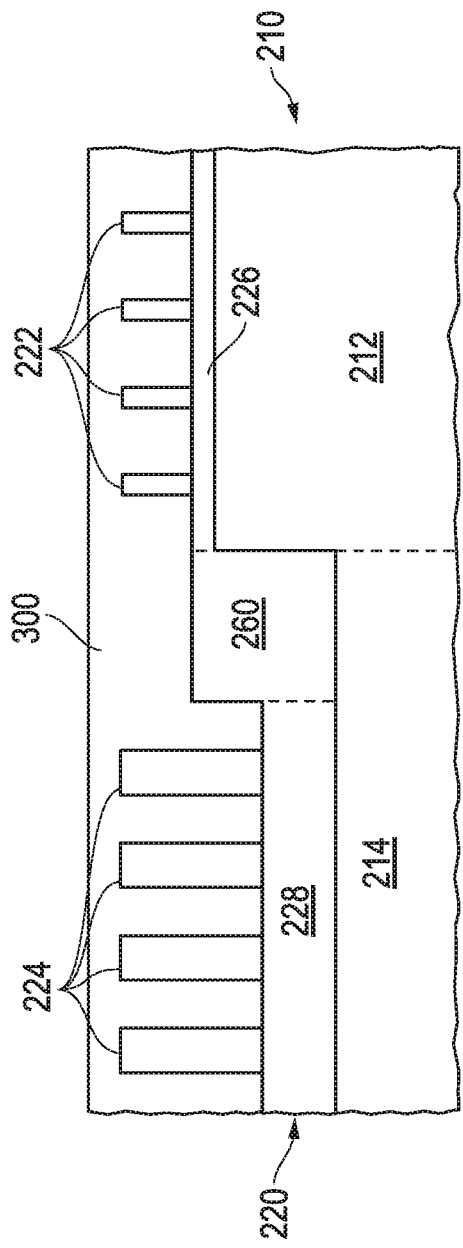
FIG. 3 includes an illustration of a cross-sectional view of the substrate of FIG. 2 after forming a planarized layer over the patterned layer.

In an embodiment, the difference in thicknesses of the portions 226, 228, and 260 of the residual layer may complicate subsequent processing of the device substrate 210. FIG. 3 illustrates the workpiece after forming a spin-on-glass (SOG) layer 300 that fills in areas between and covers the protrusions 222 and 224. The SOG layer 300 has a different composition as compared to the resist layer 220. In a particular embodiment, the resist layer 220 can include an organic material, and the SOG layer 300 includes a silicon oxide. The SOG layer 300 has a planar surface. A portion of the SOG layer 300 is removed to expose the top surfaces of the protrusions 222 and 224. In a particular embodiment, the removal is performed by an etch using a halogen-containing etch gas, and in a particular embodiment, using a fluorine-containing etch gas. The etch can be performed as a timed etch, using endpoint detection, or using endpoint detection with a timed overetch.

Figure 4:
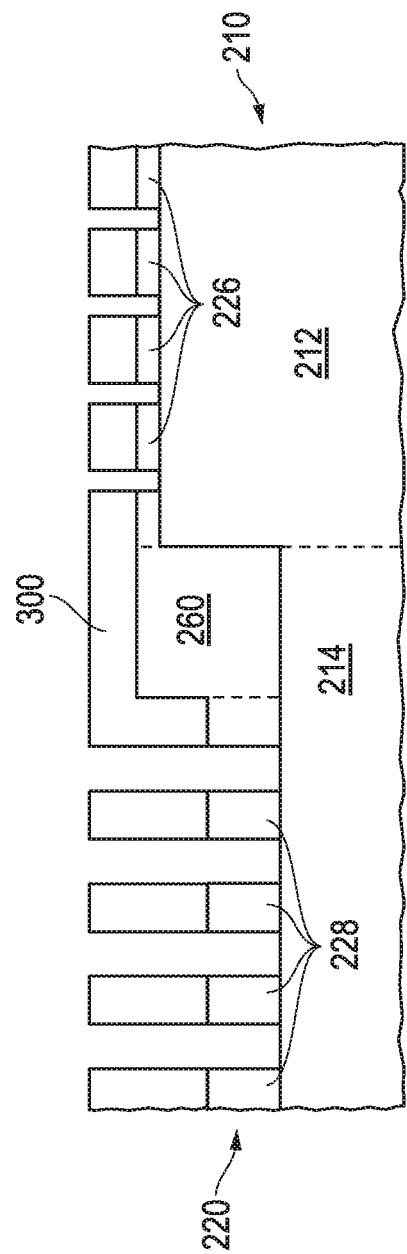
FIG. 4 includes an illustration of a cross-sectional view of the substrate of FIG. 3 after removing portions of the planarized layer over protrusions in the patterned layer and removing the exposed protrusions.

After the protrusions 222 and 224 are exposed, the protrusions 222 and 224 can be removed to leave the portions 226, 228, and 260 of the residual layer and expose portions of the device substrate 210, as illustrated in FIG. 4. The removal can be performed using an etch gas that is selective to the SOG layer 300. In a particular embodiment, the removal is performed by an etch using an oxygen-containing etch gas. The etch can be performed as a timed etch, using endpoint detection, or using endpoint detection with a timed overetch.

Exposed portions of the device substrate 210 are etched to define openings 542 and 544, and remaining portions of the SOG layer 300 and the resist layer 220 are removed, as illustrated in FIG. 5. The locations of the openings 542 and 544 in the device substrate 210 correspond to the locations of the recessions 242 and 244 in the template 230. The etch chemistry for etching device substrate 210 may depend on the material at the exposed surface of the device substrate 210. If the exposed material is polysilicon, a nitride, or a metal, such material can be etched preferentially to the SOG layer 300. If the exposed material is an oxide, the SOG layer 300 may be substantially thicker than the depth of the openings formed in the device substrate 210, or the SOG layer 300 may be replaced by another material. After reading this specification, skilled artisans will be able to select materials that are well suited for a particular application.

FIG. 6 includes an alternative embodiment for addressing the difference in elevations of the tiers 232 and 234 of the template 230 as compared to the tiers 212 and 214 of the device substrate 210. A sacrificial layer may be coated to help with planarization without making the surface completely planar. A spin-on-carbon (SOC) layer 600 can be formed overlying the device substrate 210, so that the thickness of the SOC layer 600 is thicker in region 624 overlying tier 214 of the device substrate 210, as compared to the region 622 overlying the tier 212 of the device substrate 210. The difference in elevations 620 along the exposed surface for the regions 622 and 624 can be closer to the difference in elevations 630 between the tiers 232 and 234 of the template 230 than to the difference in elevations 610 between the tiers 212 and 214 of the device substrate 210. In a particular embodiment, the difference in elevations along the exposed surface for the regions 622 and 624 can be substantially the same as the difference in elevations between the tiers 232 and 234 of the template 230. After formation of the SOC layer 600, a resist layer can be deposited and imprinted using the template 230. Over the tiers 212 and 214 and away from the exclusion zone 250, the thickness of the residual layer will be more uniform. The SOC layer 600 after patterning of the substrate is completed for the current resist layer.

Attention is now directed to methods of making and alternative designs for templates. In one set of embodiments, tiers may be formed before forming features for the template, and in another embodiment, the features are formed before forming the tiers. The tools, etchants or other means for removing material of the template can be the same as currently used in forming templates. In the figures that follow, portions of the mold of the template along the imprint surface are illustrated.

Figure 7:
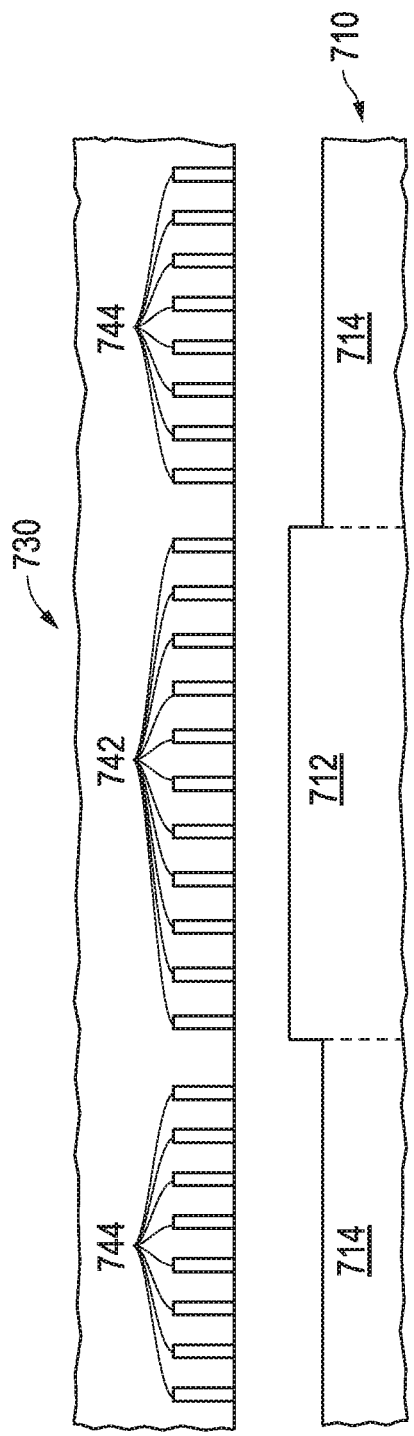
FIG. 7 includes an illustration of a cross-sectional view of portions of a device substrate and a template that is patterned to form features.
Figure 8:
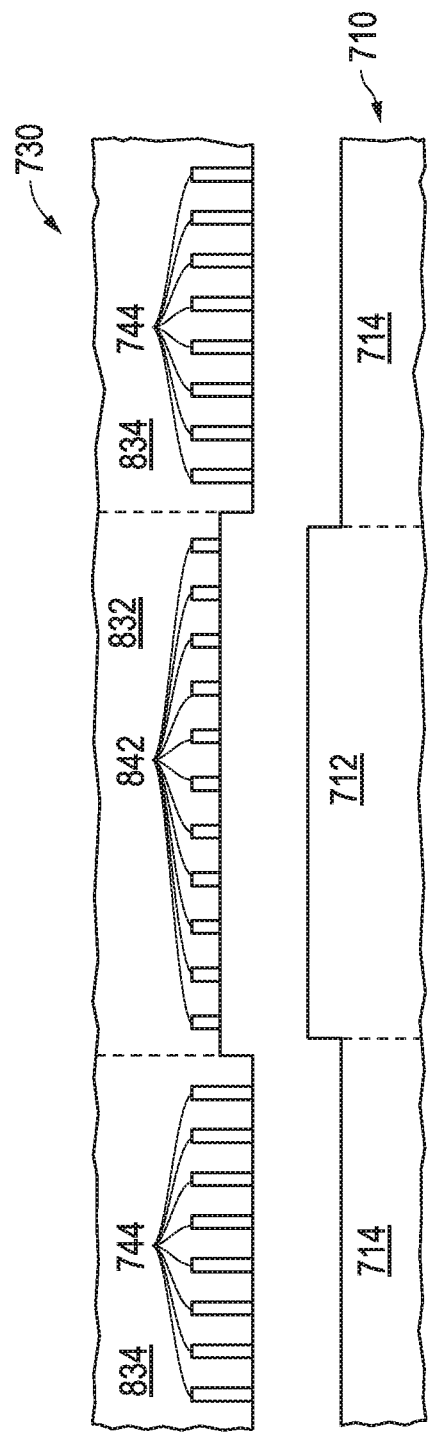
FIG. 8 includes an illustration of a cross-sectional view of the template of FIG. 7 after patterning the template to define tiers in accordance with an embodiment.

FIGS. 7 and 8 include illustrations of a template 730 in which recessions 742 and 744 are defined before tiers 832 and 834 are defined. A device substrate 710 is provided as a point of reference with respect to the template 730. The device substrate 710 includes a tier 712 tier that corresponds to a central area, and the tier 714 that corresponds to a peripheral area that surrounds the central area. The exposed surface of tier 712 lies at a higher elevation as compared to the tier 714. In FIG. 8, the tier 832 corresponds to a central area, and the tier 834 corresponds to a peripheral area that surrounds the central area.

In FIG. 7, recessions 742 and 744 are defined by removing portions of the template 730. At this point in the process, the recessions 742 and 744 can have depths that are substantially the same. In another embodiment, the recessions 742 and 744 can have depths that are within 5% of each other. Thus, proximal (bottom) surfaces of the recessions 742 and 744 may lie at substantially the same elevation. The widths of the recessions 742 and 744 may depend on the sizes of the features that are to be defined within the device substrate (not illustrated).

In FIG. 8, the template 730 is further processed to define the tiers 832 and 834. In particular, a portion of the template 730 within the central area is removed. Thus, tiers 832 and 844 are defined by the removal of material within the central area. In an embodiment, the template is not removed within the peripheral area. An exclusion zone as previously described lies within tier 832 at the boundary it shares with the tier 834.

When the material is removed from the template 730, the recessions 742 become recessions 842. The depths of the recessions 842 are significantly shallower than the recessions 742 and 744. Thus, the average depth of the recessions 744 is greater than at least 5% the average depth of the recessions 842. However, the proximal (bottom) surfaces of the recessions 842 and 744 may lie at substantially the same elevation. The widths of the recessions within the tier 832 are substantially unaffected by the removal. Thus, any particular recession 742 (before removal) has a width that is substantially the same as the width of such particular corresponding recession 842 (after removal). In a particular embodiment, the width of a particular recession 742 is within 1% of the width of such corresponding recession 842. The recessions 744 are substantially unaffected by the removal of a portion of the template when defining the tiers 832 and 834. Thus, each recession 744 has a depth and a width that is not changed or is change by at most 1% due to the removal.

The template 230 can be formed in a manner similar to the template 730 as illustrated and described with respect to FIGS. 7 and 8.

FIGS. 9 and 10 include illustrations of a template 930 in which tiers 932 and 934 are defined which before recessions 1042 and 1044 are defined. A device substrate 910 is provided as a point of reference with respect to the template 930. The device substrate 910 includes a tier 912 tier that corresponds to a central area, and the tier 914 that corresponds to a peripheral area that surrounds the central area. The exposed surface of tier 912 lies at a higher elevation as compared to the tier 914.

In FIG. 9, the tier 932 corresponds to a central area, and the tier 934 corresponds to a peripheral area that surrounds the central area. A portion of the template 730 is removed to define the tiers 932 and 934. In an embodiment, the template is not removed within the central area. An exclusion zone as previously described lies within tier 934 at the boundary it shares with the tier 932.

In FIG. 10, recessions 1042 and 1044 are defined by removing portions of the template 1030. The recessions 1042 and 1044 can have depths that are substantially the same. In another embodiment, the recessions 1042 and 1044 can have depths that are within 5% of each other. In this embodiment, proximal (bottom) surfaces of the recessions 1042 lie at a significantly different elevation than the proximal (bottom) surfaces of the recessions 1044. The widths of the recessions 1042 and 1044 may depend on the size of the features that are to be defined within the device substrate (not illustrated).

Figure 11:
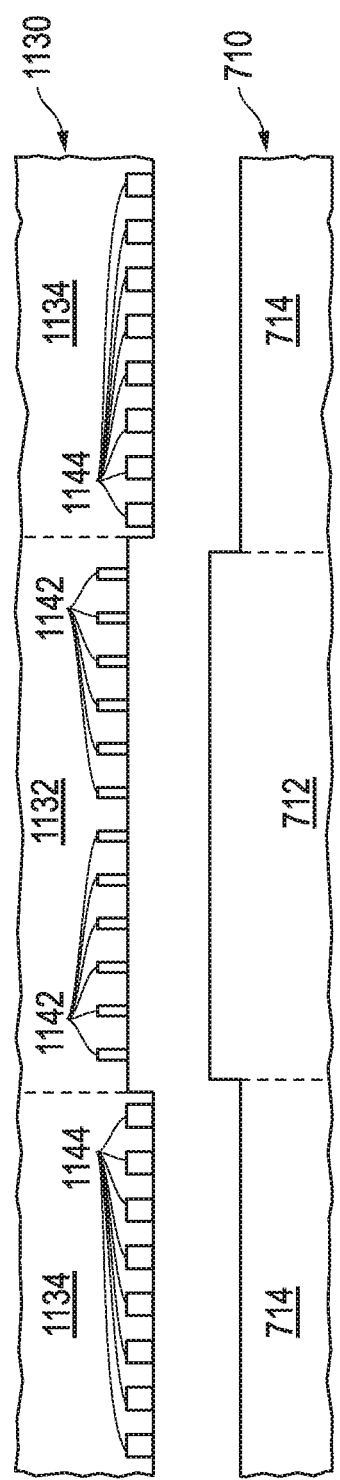
FIG. 11 includes an illustration of a cross-sectional view of the template of FIG. 7 after patterning exposed portions of the template to define features along each of the tiers in accordance with another embodiment.

FIG. 11 includes an illustration of a template 1130 having tiers 1132 and 1134. Recessions 1142 and 1144 are defined at different times as compared to each other. The recessions 1142 are recessed further into the body of the template 1130 as compared to the recessions 1144. The device substrate 710 is provided as a point of reference with respect to the template 1130.

In one embodiment, the tiers 1132 and 1134 can be defined during one removal operation, the recessions 1142 are completely defined at another removal operation, and the recessions 1144 are completely defined during yet another removal operation. For the three removal operations, any order can be selected. In another embodiment, the tiers 1132 and 1142 can be defined during one removal operation, part of the recessions 1142 and all of the recessions 1144 can be defined during another removal operation, and the reminder of the recessions 1142 may be defined during a further removal operation. The removal to define the tiers 1132 and 1134 can be performed before the other removal operations, between the other two removal operations, or after the other removal operations. In a further embodiment, a removal operation can be used to define tiers and at least part of recessions. For example, a removal operation can be performed to define the tiers 1132 and 1134 and all of the recessions 1144, and another removal operation can be used to define the recessions 1142.

As illustrated in FIGS. 7 to 11 and described in the corresponding text, skilled artisans appreciate that many different orders of performing removal operations can be used when defining tiers and features within each of the tiers. The particular order of forming the tiers and recessions can be tailored to meet the needs or desires for a particular application.

In another embodiment, the features may be protrusions instead of recessions. In this embodiment, most of the imprint surface within a tier may be recessed with relatively less surface area at the distal surfaces of the template, wherein the protrusions correspond to the residual layer of the resist layer after imprinting. The prior discussions of depths of recessions correspond to heights of protrusions.

Embodiments of templates as described herein can allow for the processing of a device substrate having substantial differences in elevations between exposed surfaces along the device substrate without having to require a complicated planarization process. The templates can be well suited for three-dimensional (3D) memories that may have 16, 32, 48, or more stacked gate electrodes. Each gate electrode can have a corresponding insulating layer to keep any two gate electrodes from shorting to each other. Thus, over 30, 100, or more layers may be present within a memory array that are not present within peripheral areas of the device substrate. Planarization of such a device substrate may be very difficult or even impossible, particularly as device dimensions continue to decrease.

The templates as described herein can be used to pattern layers at different tiers at the same time. For example, contact openings can be made to the gate electrodes within the memory array while forming contact openings to bit lines and electrical components outside the memory array using the same template and imprint operation.

The use of the templates is not limited to memory devices. Other electronic devices may have significant elevational differences. For example, vertical segments of a helical inductor may result in significant elevational differences between the upper portions of the inductor and other areas of the device substrate. The templates with features in different tiers can help in the formation of the helical inductor and other electrical components of the device substrate.

Many different aspects and embodiments are possible. Some of those aspects and embodiments are described below. After reading this specification, skilled artisans will appreciate that those aspects and embodiments are only illustrative and do not limit the scope of the present invention.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A template for imprint lithography comprising an active area including:
    a plurality of tiers including a first tier and a second tier; and
    a feature within the first tier or the second tier, wherein the first tier is recessed farther into the template, as compared to the second tier and wherein the first and second tiers comprise features, including the first feature, wherein an average width of features in the first tier are smaller than the average width of features in the second tier.

2. The template of claim 1, wherein the first and second tiers comprise features, including the feature, wherein:
    all depths of the features of the first and second tiers are within 5% of an average depth of the features of the first and second tiers; or
    all heights of the features of the first and second tiers are within 5% of an average height of the features of the first and second tiers.

3. The template of claim 1, wherein the first and second tiers comprise features, including the feature, wherein:
    a depth of a particular feature of the first tier is at least 5% greater than a depth of a particular feature of the second tier;
    a depth of a particular feature of the second tier is at least 5% greater than a depth of a particular feature of the first tier;
    a height of a particular feature of the first tier is at least 5% greater than a height of a particular feature of the second tier; or
    a height of a particular feature of the second tier is at least 5% greater than a height of a particular feature of the first tier.

4. The template of claim 3, wherein all of the features within the first and second tiers have corresponding proximal surfaces that lie at substantially the same elevation.

5. The template of claim 1, wherein the first tier corresponds to a memory array, and the second corresponds to a region outside the memory array.

6. The template of claim 1, wherein the first tier includes an exclusion zone.

7. A template for imprint lithography comprising an active area including:
    a plurality of tiers including a first tier and a second tier; and
    a feature within the first tier or the second tier, wherein the first tier corresponds to a memory array, and the second tier corresponds to a region outside the memory array, and wherein the first and second tiers comprise features, including the first feature, wherein an average width of features in the first tier are smaller than the average width of features in the second tier.

8. The template of claim 7, wherein the first and second tiers comprise features, including the feature, wherein:

all depths of the features of the first and second tiers are within 5% of an average depth of the features of the first and second tiers; or all heights of the features of the first and second tiers are within 5% of an average height of the features of the first and second tiers.

9. The template of claim 7, wherein the first and second tiers comprise features, including the feature, wherein:
a depth of a particular feature of the first tier is at least 5% greater than a depth of a particular feature of the second tier;
a depth of a particular feature of the second tier is at least 5% greater than a depth of a particular feature of the first tier;
a height of a particular feature of the first tier is at least 5% greater than a height of a particular feature of the second tier; or
a height of a particular feature of the second tier is at least 5% greater than a height of a particular feature of the first tier.

10. The template of claim 9, wherein all of the features within the first and second tiers have corresponding proximal surfaces that lie at substantially the same elevation.

11. The template of claim 7, wherein the first and second tiers comprise features, including the first feature, wherein an average width of features in the first tier are smaller than the average width of features in the second tier.

12. The template of claim 11, wherein the first tier is recessed farther into the template, as compared to the second tier.

13. The template of claim 7, wherein the first tier includes an exclusion zone.

* * * * *